(12) United States Patent
Chi

(10) Patent No.: US 8,281,086 B2
(45) Date of Patent: Oct. 2, 2012

(54) DE-INTERLEAVING AND INTERLEAVING FOR DATA PROCESSING

(75) Inventor: Mi-Ock Chi, Seoul (KR)

(73) Assignee: Core Logic, Inc., Seoul (KR)

( * ) Notice: Subject to any disclaimer, the term of this patent is extended or adjusted under 35 U.S.C. 154(b) by 1125 days.

(21) Appl. No.: 12/168,038

(22) Filed: Jul. 3, 2008

(65) Prior Publication Data

US 2009/0013136 A1    Jan. 8, 2009

(30) Foreign Application Priority Data

Jul. 6, 2007 (KR) .................. 10-2007-0067843

(51) Int. Cl.
*G06F 12/00* (2006.01)
(52) U.S. Cl. ............................ 711/157; 711/E12.079
(58) Field of Classification Search .............. 711/157
See application file for complete search history.

(56) References Cited

U.S. PATENT DOCUMENTS

| | | | |
|---|---|---|---|
| 6,668,343 | B1 | 12/2003 | Kim et al. |
| 6,857,087 | B2 * | 2/2005 | Crozier et al. ............... 714/702 |
| 2003/0048206 | A1 * | 3/2003 | Gatherer et al. ............... 341/50 |
| 2005/0166125 | A1 | 7/2005 | Eroz et al. |
| 2008/0115032 | A1 * | 5/2008 | Henige et al. ............... 714/755 |

FOREIGN PATENT DOCUMENTS

| | | |
|---|---|---|
| EP | 1 315 299 A1 | 5/2003 |
| KR | 10-0459114 B1 | 11/2004 |
| WO | 00/38333 A1 | 6/2000 |

OTHER PUBLICATIONS

"Radio Broadcasting Systems; Digital Audio Broadcasting (DAB) to mobile, portable and fixed receivers," European Standard (Telecommunications series), ETSI EN 300 401 V1.4.1 (Jun. 2006).

* cited by examiner

*Primary Examiner* — Kevin Ellis
*Assistant Examiner* — Aracelis Ruiz
(74) *Attorney, Agent, or Firm* — Edwards Wildman Palmer LLP

(57) ABSTRACT

Among others, techniques and apparatus are described for de-interleaving. A data processing apparatus includes a buffer to store interleaved data; an interleaving index producing unit to produce an interleaving index of the interleaved data; and an output control unit to output the data stored in the buffer using the interleaving index.

17 Claims, 6 Drawing Sheets

US 8,281,086 B2

DE-INTERLEAVING AND INTERLEAVING FOR DATA PROCESSING

CLAIM OF PRIORITY

This application claims priority under 35 USC §119(a) to Korean Patent Application No.10-2007-0067843, filed on Jul. 6, 2007, in the Korean Intellectual Property Office, the entire contents of which are hereby incorporated by reference.

TECHNICAL FIELD

The present invention relates to de-interleaving in data processing and/or transmission.

BACKGROUND

In data processing and transmission, interleaving may refer to separating storage spaces of adjacent data from each other in data storage of hardware. In particular, interleaving may refer to transmitting data signal in a non-contiguous way in wireless data communication. An interleaver can include apparatus that performs at least one of the described interleaving processes.

Interleaving can reduce a burst error of object data for transmission. Interleaving transmits data in a non-contiguous order of row or column of the data. Thus when a burst error that may occur in a deep fading channel caused by the external environment such as rain or lightning occurs to signals transmitted through a medium such as air, the burst error can be converted into a random error to improve error correct and data restore performances at a receiving terminal in a subsequent process.

SUMMARY

In one aspect, a data processing apparatus includes a buffer to store interleaved data; an interleaving index producing unit to produce an interleaving index of the interleaved data; and an output control unit to output the interleaved data stored in the buffer using the interleaving index.

Implementations can optionally include one or more of the following features. The output control unit can output the interleaved data stored in the buffer based on an order of production of the interleaving index. The buffer can sequentially store the interleaved data based on an order of receiving the interleaved data. The interleaving index producing unit can produce the interleaving index using at least one logic block corresponding to a mathematical equation for interleaving the interleaved data. The interleaving index producing unit can produce the interleaving index using at least one logic block corresponding to a mathematical equation associated with a transmission mode of the interleaved data.

Also, implementations can optionally include one or more of the following features. The interleaving index producing unit can include a mode determining unit to determine a transmission mode of the interleaved data; a multiplier to perform a multiplication operation on a resulting value of a previous modular operation and an interleaving initial constant value; an adder to perform an addition operation on a resulting value of the multiplication operation and an add-constant corresponding to the determined transmission mode; a modular operating unit to perform a modular operation on a resulting value of the addition operation using a modular-constant corresponding to the determined transmission mode; a modular operation determining unit to determine whether a resulting value of the modular operation corresponds to an allowable range of the determined transmission mode; a subtractor to perform a subtraction operation on the resulting value of the modular operation and a subtract-constant corresponding to the determined transmission mode when determined that the resulting value of modular operation corresponds to the allowable range of the determined transmission mode; and a feedback unit to feedback the resulting value of modular operation to the multiplier. The modular operating unit can perform a modular operation on the resulting value of addition operation using a bit equal to or lower than the modular-constant. Further, an operating frequency for producing the interleaving index is set higher than an operating frequency of the data output.

In another aspect, an interleaving index producing apparatus is designed to produce an interleaving index of an interleaved data used in de-interleaving output control of the interleaved data stored in a predetermined buffer memory. The interleaving index producing apparatus produces the interleaving index using at least one logic block corresponding to a mathematical equation for interleaving the interleaved data.

Implementations can optionally include one or more of the following features. The interleaving index producing unit can include a mode determining unit to determine a transmission mode of the interleaved data. The interleaving index producing unit can include a multiplier to perform a multiplication operation on a resulting value of a previous modular operation and an interleaving initial constant value. Also, the interleaving index producing unit can include an adder to perform an addition operation on a resulting value of the multiplication operation and an add constant corresponding to the determined transmission mode. The interleaving index producing unit can include a modular operating unit to perform a modular operation on a resulting value of the addition operation using a modular constant corresponding to the determined transmission mode. In addition, the interleaving index producing unit can include a modular operation determining unit to determine whether a resulting value of the modular operation is within an allowable range of the determined transmission mode. The interleaving index producing unit can include a subtractor to perform a subtraction operation on the resulting value of modular operation and a subtract constant corresponding to the determined transmission mode when the resulting value of modular operation is within an allowable range of the determined transmission mode. Further, the interleaving index producing unit can include a feedback unit to feedback the resulting value of modular operation to the multiplier.

In yet another aspect, a data processing method includes storing interleaved data; producing an interleaving index of the interleaved data; and outputting the stored interleaved data using the interleaving index.

Implementations can optionally include one or more of the following features. Outputting can include outputting the stored interleaved data based on an order of producing the interleaving index. Storing the interleaved data can include sequentially storing the interleaved data based on an order of receiving the interleaved data. Producing the interleaving index can include producing the interleaving index using at least one logic block corresponding to a mathematical equation for interleaving the interleaved data. Producing the interleaving index can include producing the interleaving index using at least one logic block corresponding to a mathematical equation defined for each transmission mode of the interleaved data. Producing the interleaving index can include determining a transmission mode of the interleaved data; performing a multiplication operation on a resulting value of a previous modular operation and an interleaving initial interleaving constant value; performing an addition operation on a resulting value of the multiplication operation and an add constant corresponding to the determined transmission mode; performing a modular operation on a resulting value of the addition operation using a modular constant corresponding to the determined transmission mode; determining whether a resulting value of the modular operation is within an allowable range of the determined transmission mode; performing a subtraction operation on the resulting value of the modular operation and a subtract constant corresponding to the determined transmission mode when the resulting value of the modular operation is determined to be within the allowable range of the determined transmission mode; and feedbacking the resulting value of the modular operation to the multiplier. Also, performing the modular operating can include performing a modular operation on the resulting value of addition operation using a bit equal to or lower than the modular constant. Further, an operating frequency for producing the interleaving index can be set at a higher level than an operating frequency of the data output.

In yet another aspect, an interleaving index producing method includes producing an interleaving index of an interleaved data used in de-interleaving output control of the interleaved data stored in a predetermined buffer memory. The interleaving index is produced using at least one logic block corresponding to a mathematical equation for interleaving the interleaved data.

Implementations can optionally include one or more of the following features. Producing the interleaving index can include determining a transmission mode of the interleaved data; performing a multiplication operation on a resulting value of a previous modular operation and an interleaving initial interleaving constant value; performing an addition operation on a resulting value of the multiplication operation and an add constant corresponding to the determined transmission mode; performing a modular operation on a resulting value of the addition operation using a modular constant corresponding to the determined transmission mode; determining whether a resulting value of the modular operation is within an allowable range of the determined transmission mode; performing a subtraction operation on the resulting value of modular operation and a subtract constant corresponding to the determined transmission mode when the resulting value of modular operation is determined to be within the allowable range of the determined transmission mode; and feedbacking the resulting value of the modular operation to the multiplier.

The techniques, apparatus and systems as described in this specification can also be implemented using a computer readable medium embodying instructions to cause a data processing apparatus to perform de-interleaving operations.

The techniques, systems and computer program product as described in this specification can optionally provide one or more of the following advantages. For example, the use of table reference can be eliminated for de-interleaving. In addition, an interleaving index can be produced through a logic block. Also, de-interleaving can be performed using the produced interleaving index in data output to improve a de-interleaving efficiency and considerably reduce the size of hardware resources, such as a memory unit. Thus, efficient and economical data processing apparatus and techniques can be achieved.

These and other features, aspects, and advantages of the present disclosure can be implemented by configurations recited in the following claims and figures.

BRIEF DESCRIPTION OF THE DRAWINGS

Only a few embodiments of the present disclosure are described with reference to the accompanying drawings.

Like reference numerals represent like features in the above figures.

DETAILED DESCRIPTION

Figure 1:
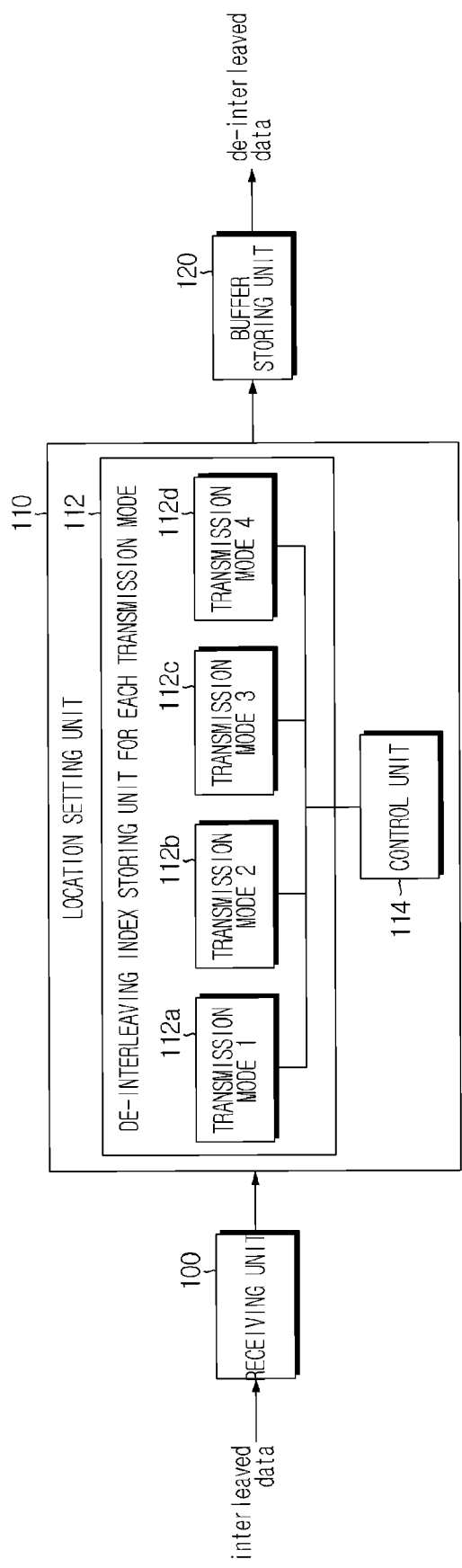
FIG. 1 is a block diagram illustrating an example conventional de-interleaving configuration using a table reference method.

Techniques, systems and computer program products are described for de-interleaving in data transmission and processing. De-interleaving can be implemented to incorporate a data relationship (e.g., represented by a mathematical equation) for interleaving using a logic block mechanism and a logic technique. De-interleaving can be implemented using simple and small hardware resource, respectively.

While this specification contains many specifics, these should not be construed as limitations on the scope of the disclosure or of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

The various configurations shown in the accompanying drawings are presented for illustrative purposes and are not meant to limit the scope of the present disclosure.

An example configuration of interleaving in T-DMB (terrestrial digital multimedia broadcasting) environment is described for illustrative purposes.

TABLE 1

| | | | | | (a) | | | | | |
|---|---|---|---|---|---|---|---|---|---|---|
| # | 0 | 1 | 2 | 3 | 4 | 5 | 6 | 7 | 8 | 9 |
| LOCATION | 0 | 1 | 2 | 3 | 4 | 5 | 6 | 7 | 8 | 9 |
| data | a | b | c | d | e | f | g | h | i | j |
| | | | | | (b) | | | | | |
| # | 0 | 1 | 2 | 3 | 4 | 5 | 6 | 7 | 8 | 9 |
| LOCATION | 0 | 5 | 3 | 1 | 8 | 2 | 6 | 4 | 7 | 9 |
| data | a | f | d | b | i | c | g | e | h | j |

Table 1(a) above represents contiguous data transmission. When a burst error occurs to the data (e.g., data corresponding to #3 to #6) due to the external environment, severe damage occurs to the continuity of the transmitted data while the transmitted data is going through error correction at a receiving terminal. Such severe damage makes data restoration difficult or at the very least reduces the performance of data restoration.

In contrast to above, Table 1(b) above shows a non-contiguous data transmission. When a burst error occurs to the data (e.g., data corresponding to #3 to #6), the burst error is converted into a random error that occurred to data corresponding to other locations (e.g., 1, 8, 2 and 6). Thus, during error correction at the FEC (Forward Error Correction) block of a receiving terminal, data restoration performance is improved, and the degree of damage that causes continuity of the actual data is reduced.

For illustrative purposes, a configuration of conventional interleaving and de-interleaving is described in this specification based on ETSI (European Telecommunications Standards Institute) EN 300 401. Interleaving can be performed such that the order of transmitting the object data is changed by a predetermined rule and the data is transmitted in the changed order. Such predetermined rule can be represented by Equation 1 below.

$$y_{l,k} = q_{l,k} \text{ for } l=1,2,3,4\ldots L \quad \text{Equation 1}$$

In Equation 1, 'q' is QPSK (Quadrature Phase Shift Keying) mapped symbol, 'y' is a frequency interleaved symbol, 'l' is OFDM (Orthogonal Frequency Division Multiplexing) symbol index, and 'n' is QPSK symbol index. The allowable range includes '$-K/2 \leq k$ (carrier index)$\leq 0$ and $0 \leq k \leq K/2$'.

Interleaving is performed in the data located at the same OFDM symbol among the QPSK mapped symbols based on a formula of k=F(n). ETSI EN 300 401 includes four transmission modes, and has a frequency interleaving function (F(n)) for each transmission mode to perform an optimum interleaving for each transmission mode.

A mathematical equation for interleaving and a conversion table defined for each transmission mode are described below.

(Transmission mode 1)

$$k = F(n) = d_n - 1024$$

$$d_n = \Pi(i) \text{ if } 256 \leq \Pi(i) \leq 1792 \text{ excluding } 1024$$

$$\Pi(i) = [13 * \Pi(i-1) + 511](\text{mod } 2048) \text{ and } \Pi(0) = 0 \quad \text{Equation 2}$$

An interleaving rule in transmission mode 1 is shown in Table 2 as follows.

TABLE 2

| i | $\Pi(i)$ | $d_n$ | n | k |
|---|---|---|---|---|
| 0 | 0 | | | |
| 1 | 511 | 511 | 0 | −513 |
| 2 | 1010 | 1010 | 1 | −14 |
| 3 | 1353 | 1353 | 2 | 329 |
| 4 | 1716 | 1716 | 3 | 692 |
| 5 | 291 | 291 | 4 | −733 |
| 6 | 198 | | | |
| 7 | 1037 | 1037 | 5 | 13 |
| 8 | 1704 | 1704 | 6 | 680 |
| 9 | 135 | | | |
| 10 | 218 | | | |
| 11 | 1297 | 1297 | 7 | 273 |
| 12 | 988 | 988 | 8 | −36 |
| 13 | 1076 | 1067 | 9 | 43 |
| 14 | 46 | | | |
| 15 | 1109 | 1109 | 10 | 85 |
| 16 | 592 | 592 | 11 | −432 |
| 17 | 15 | | | |

TABLE 2-continued

| i | $\Pi(i)$ | $d_n$ | n | k |
|---|---|---|---|---|
| 18 | 706 | 706 | 12 | −318 |
| ... | ... | ... | | |
| 2044 | 1676 | 1676 | 1533 | 652 |
| 2045 | 1819 | | | |
| 2046 | 1630 | 1630 | 1534 | 606 |
| 2047 | 1221 | 1221 | 1535 | 197 |

In Table 2, an index of column k is an interleaving index. Data is rearranged according to the interleaving rule and is transmitted. Specifically, according to Equation 2, an initial value of $\Pi(i)$ is set to $\Pi(0)=0$ and $\Pi(1)=[13 \times \Pi(0)(=0)+511]$ (mod 2048)=511, the value 511 becomes '$d_1$', and thus, k=(F(1))=511−1024=−513.

In the same way, $\Pi(2)=[13 \times \Pi(1)+511]$ (mod 2048)=13×(511)+511 mod(2048)=7154 (mod 2048)=1010, and thus, k=F(2)=1010−1024=−14.

Using the above-described procedure, an interleaving index is produced. In addition, the sequentially arranged data is rearranged by the produced interleaving index, and the rearranged data is transmitted. According to the interleaving rule, in transmission mode 1, only when $\Pi(i)$ is between 256 and 1792, an interleaving index is produced. When $\Pi(i)$ is not within the above-described range, an interleaving index is not produced. Table 2 also includes empty rows under column k of the interleaving index. This is because of the above-described rule that governs whether to produces an interleaving index.

Similar to transmission mode 1, each of transmission modes 2, 3 and 4 produces an interleaving index and a de-interleaving index by using the following conversion Equations 3, 4 and 5 based on the transmission mode.

$$K = d_n - 256$$

$$d_n = \Pi(i)\text{'s subset}, 64 <= \Pi(i) <= 448, \text{excluding } 256$$

$$\Pi(i) = 13 * \Pi(i-1) + 127(\text{mod } 512) \text{ and }$$
$$\Pi(0) = 0 \quad \text{Equation 3 (for transmission mode 2)}$$

$$K = d_n - 128$$

$$d_n = \Pi(i)\text{'s subset}, 32 <= \Pi(i) <= 224, \text{excluding } 128$$

$$\Pi(i) = 13 * \Pi(i-1) + 63(\text{mod } 256) \text{ and }$$
$$\Pi(0) = 0 \quad \text{Equation 4 (for transmission mode 3)}$$

$$K = d_n - 512$$

$$d_n = \Pi(i)\text{'s subset}, 132 <= \Pi(i) <= 896, \text{excluding } 512$$

$$\Pi(i) = 13 * \Pi(i-1) + 255(\text{mod } 1024) \text{ and }$$
$$\Pi(0) = 0 \quad \text{Equation 5 (for transmission mode 4)}$$

Detailed description of Equations 3, 4 and 5, respectively, and Tables corresponding to the transmission modes 2, 3 and 4 is omitted.

As described above, frequency interleaving in DAB (Digital Audio Broadcasting) is performed by four independent interleaving indexes for each transmission mode. In addition, de-interleaving is performed by an independent process for each transmission mode.

Thus, a de-interleaver at a receiving terminal (Rx) produces a de-interleaving index corresponding to an interleaving index. The de-interleaver also performs de-interleaving based on the produced de-interleaving index to obtain an original source data.

However, an inverse function of Equation 2 is needed to produce a de-interleaving index corresponding to an interleaving index. It is difficult to mathematically represent the inverse function. Thus, the de-interleaving index is stored in a form of a look-up table, and de-interleaving is performed with reference to the look-up table. On average, the size of a memory needed to form the look-up table is about 29 Kbit. Accordingly, if the interleaved data inputted into the de-interleaver is written in a de-interleaved memory using the de-interleaving index and the de-interleaved memory is read in a sequential order, a source data before interleaving is obtained.

FIG. 1 is a block diagram illustrating a conventional de-interleaving configuration that uses look-up table referencing. A conventional de-interleaving apparatus includes a receiving unit 100, a location setting unit 110 and a buffer storing unit 120. The location setting unit 110 includes de-interleaving index storing units 112a, 112b, 112c and 112d for each transmission mode, and a control unit 114.

The receiving unit 100 receives an interleaved data and serves as an interface to the location setting unit 110. The control unit 114 of the location setting unit 110 determines the transmission mode recorded in the interleaved data transmitted through the receiving unit 100.

After the transmission mode is determined, the control unit 114 operates to transmit the data to the buffer storing unit 120. In addition, the control unit controls the writing of the transmitted data in a corresponding location using a de-interleaving index for each transmission mode stored already in the de-interleaving index storing unit 112.

Through the above-described process, de-interleaving is performed such that an external reading apparatus reads the data stored in the buffer storing unit 120 in a sequential order to output the de-interleaved data. However, the conventional de-interleaving as described with respect to FIG. 1 needs to generate and store a look-up table for each transmission mode beforehand. Thus, a memory unit is needed to store the generated look-up table. Further, a memory unit for each transmission mode is needed. Thus, a memory resource should be provided, which results in an expensive de-interleaver.

Figure 2:
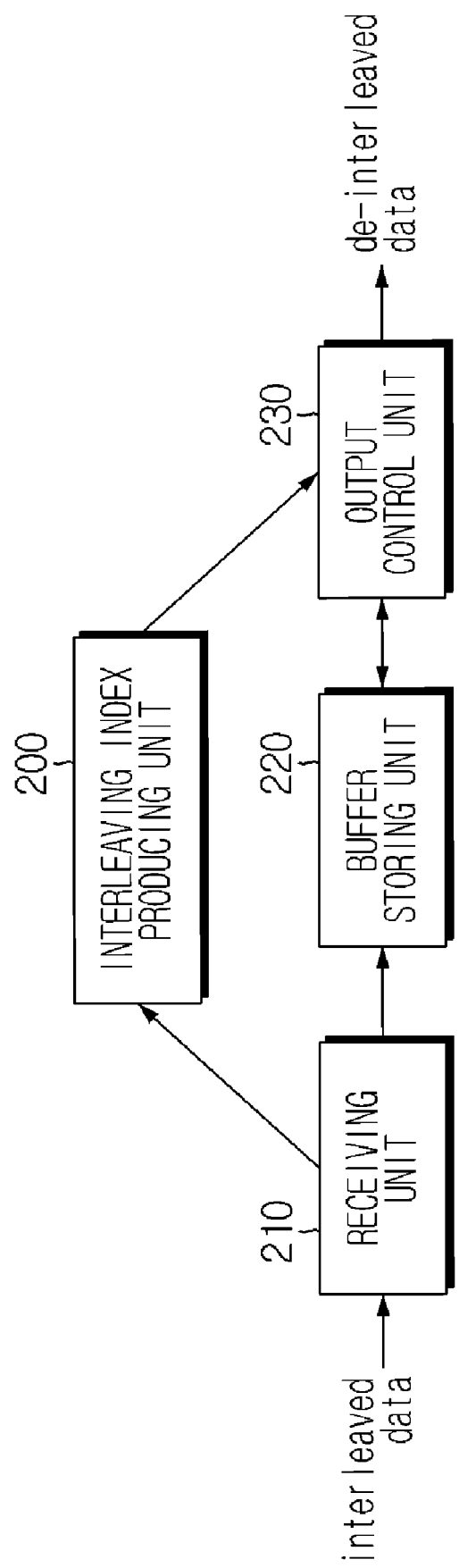
FIG. 2 is a block diagram illustrating an example de-interleaving apparatus.
Figure 5:
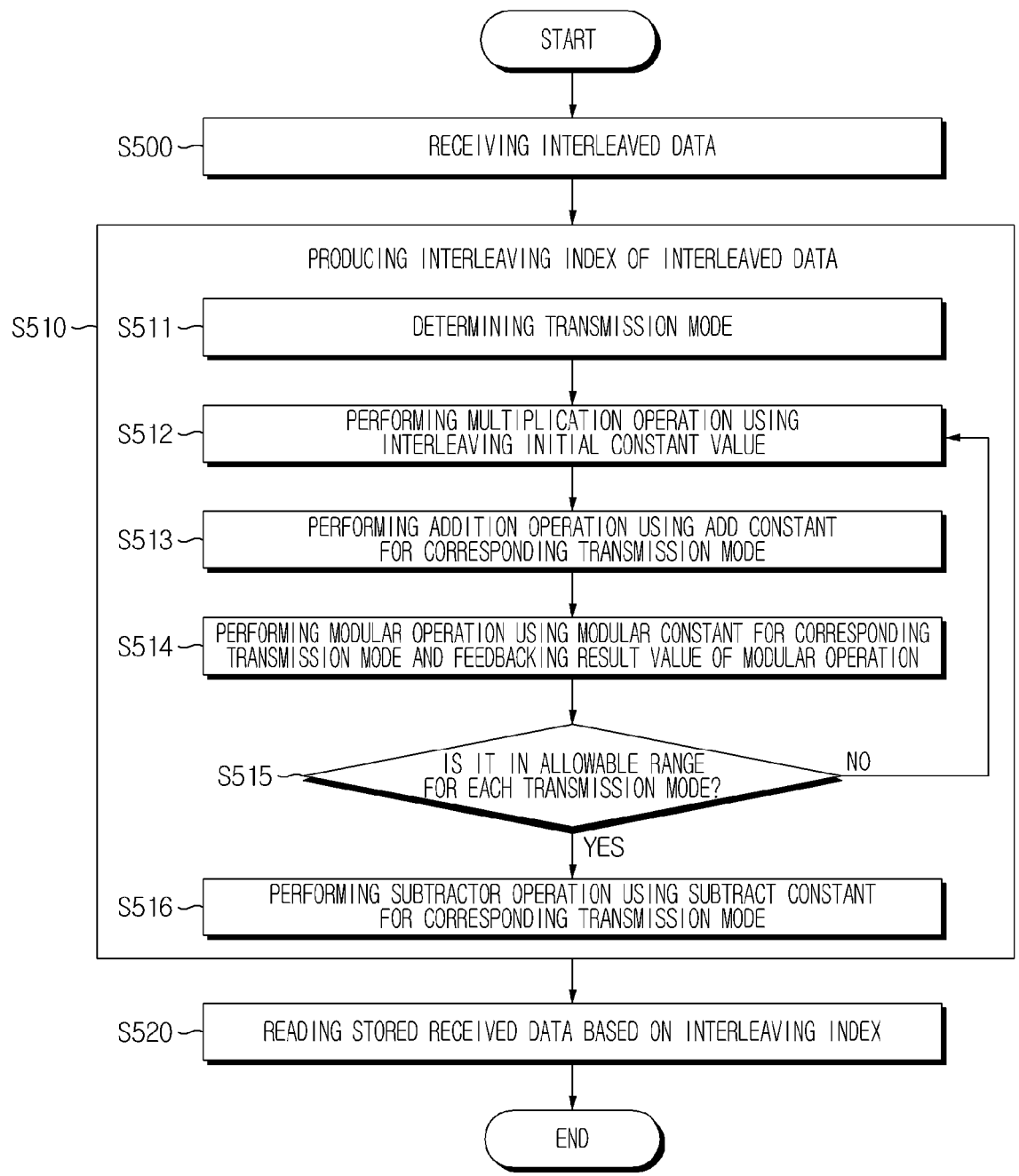
FIG. 5 is a flow chart illustrating an example de-interleaving process.

FIG. 2 is a block diagram illustrating an example de-interleaving apparatus according to techniques described in this specification. FIG. 5 is a flow chart illustrating an example de-interleaving process that can be implemented using the apparatus of FIG. 2. Thus, the de-interleaving apparatus and method according to the present invention is described through FIGS. 2 and 5.

The de-interleaving apparatus as described in this specification includes an interleaving index producing unit 200, a receiving unit 210, a buffer storing unit 220 and an output control unit 230. The receiving unit 210 serves as an interface for receiving an interleaved data from a transmission device and transmitting the received interleaved data to a device as described in this specification.

FIG. 5 is a flow chart illustrating an example de-interleaving process that can be implemented using a de-interleaving apparatus (e.g., an apparatus described with respect to FIG. 2 above). The interleaved data received through the receiving unit 210 is stored into the buffer storing unit 220 (S500). The interleaving index producing unit 200 produces an interleaving index of the interleaved data (S510) and provides the interleaving index to the output control unit 230. Unlike the conventional system of FIG. 1, the interleaving index producing unit 200 does not perform de-interleaving using a de-interleaving index that corresponds to an interleaving index. In contrast to the conventional system, the interleaving index producing unit 200 performs de-interleaving using an interleaving index itself.

Thus, the de-interleaving process as described in this specification does not use a de-interleaving index that corresponds to an interleaving index, but instead stores the received interleaved data into a memory of the buffer storing unit 220. When the output control unit 230 reads the data stored in the buffer storing unit 220, the interleaving index received from the interleaving index producing unit 200 is implemented. Thus, the de-interleaving process as described in this specification is performed while reading the data.

When detected that the output control unit 230 includes a temporary memory when reading the data, the output control unit 230 may read the data of a corresponding interleaving index regardless of an order of production of the interleaving index and record the read data into a corresponding location of the temporary memory again in a sequential order. When the output control unit 230 is controlled to read the data according to an order of production of the interleaving index, the output control unit 230 does not need a temporary memory to realize more efficient de-interleaving.

Figure 6:
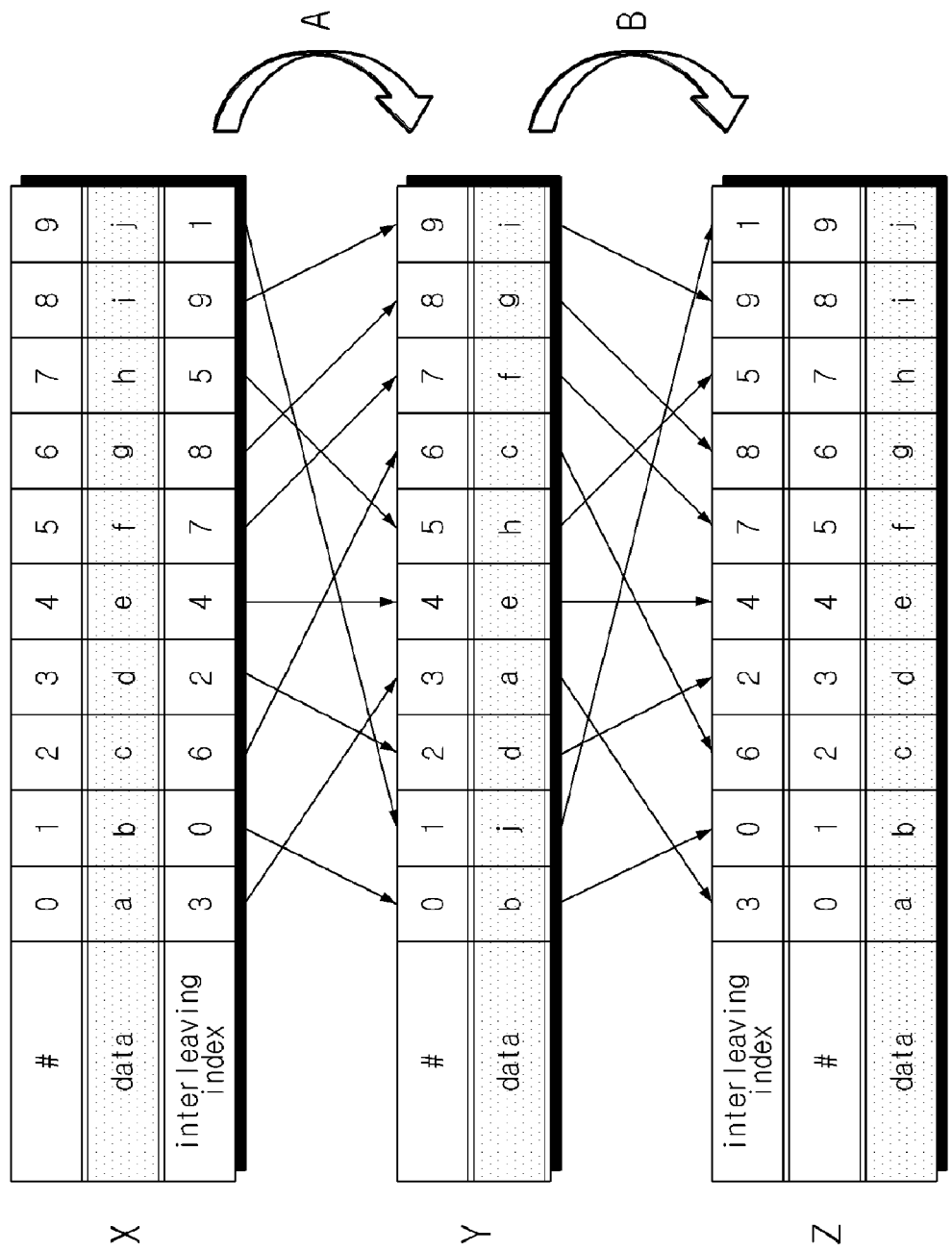
FIG. 6 is a view illustrating an example process for interleaving and de-interleaving.

FIG. 6 illustrates example interleaving and de-interleaving processes. As shown in FIG. 6, "X" data (a, b, c, d, e, f, g, h, i and j) includes object data for transmission. In addition, the "X" data is shown together with location information (#) and interleaving index.

FIG. 6 also shows "Y" data that includes interleaved data (b, j, d, a, e, h, c, f, g and i). As shown in FIG. 6, the "Y" data is shown in a state of rearrangement based on an interleaving index. The "Y" data corresponds to the data received in the receiving unit 210 and the interleaved data stored in the buffer storing unit 220.

FIG. 6 also shows "Z" data that includes de-interleaved data obtained by implementing the de-interleaving process as described in this specification.

The downward arrow located between "X", "Y" and "Z" data of FIG. 6 represents a sequence of rearrangement by the interleaving index. The curved arrow A represents a process for changing "X" data to "Y" data, i.e. an interleaving step. The "Y" data is transmitted through a channel and received by a receiving terminal.

As described above, the receiving terminal receives the "Y" data, and the received data is separately stored into a storing unit such as a memory. When storing the received data at a corresponding storage location in the order of receiving the data, various techniques can be implemented for setting the storage location into the memory. When the data received at the receiving terminal is stored into the memory in a sequential order, it may be more efficient to read the stored data corresponding to the interleaving index using the interleaving index in a subsequent process.

The curved arrow "B" represents reading the data stored in the memory using the interleaving index. The interleaving index producing unit 200 produces the interleaving index. Accordingly, de-interleaving is performed by sequentially reading data corresponding to the interleaving index in the order of production of the interleaving index.

For the example data shown in FIG. 6, the interleaving index producing unit 200 has interleaving indexes of 3, 0, 6, 2, 4, 7, 8, 5, 9 and 1. The interleaving indexes correspond to the location information used for interleaving. Thus, reading the stored data in the order of the interleaving index allows a natural realization of de-interleaving. For example, when reading the "Y" data stored in the memory, data [a] located at the first interleaving index "3" is read first.

Next, data [b] of the "Y" data located at the second interleaving index "0" is read. Then, data [c] of the "Y" data located at the interleaving index "6" is read.

Through a series of above-described process, the data is read in the order of the interleaving index, and thus the de-interleaved data, i.e. "Z" data is outputted. As shown in the arrow B of FIG. 6, de-interleaving is performed by having the output control unit 230 output the stored "Y" data as "Z" data using the interleaving index produced by the interleaving index producing unit 200.

As described above, the interleaving index is generated based on a mathematical function relation. Thus, the interleaving index can be implemented using at least one logic block, i.e. a combinational logic corresponding to a mathematical equation representing the mathematical function relation.

When data is transmitted according to a transmission mode, a mathematical equation for interleaving the data is defined for each transmission mode. Thus, the interleaving index is produced using at least one logic block corresponding to a mathematical equation for de-interleaving defined for each transmission mode.

An interleaving index can be implemented using a logic unit corresponding to each operator in Equations 2, 3, 4 and 5 to effectively overcome a conventional memory consumption method and realize more economical and efficient de-interleaving.

Figure 3:
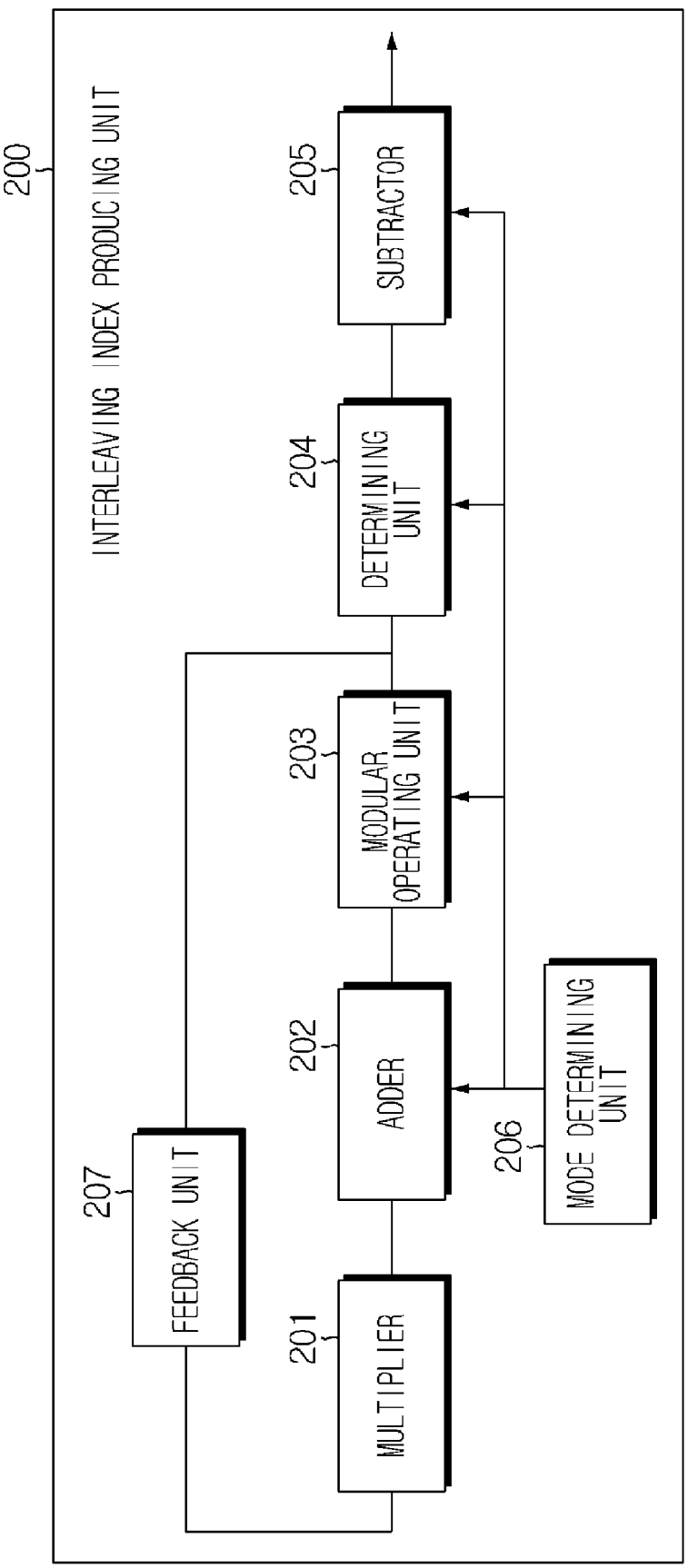
FIG. 3 is a block diagram illustrating an example configuration of an interleaving index producing unit of a de-interleaving apparatus.

FIG. 3 is a block diagram illustrating an example configuration of the interleaving index producing unit 200 of the de-interleaving apparatus according to the present specification. A logic configuration of the interleaving index producing unit 200 and an interleaving index producing process is described with reference to FIGS. 3 and 5.

Each component of the de-interleaving apparatus as described in the present specification is not defined or limited by particular physical structures. Instead, the components are described using logic units. That is, each component of the de-interleaving apparatus corresponds to a logic component for realizing the techniques of the present specification. Thus, various logic configurations can be implemented regardless of whether the components are operated integrally or separately.

The interleaving index producing unit 200 includes a mode determining unit 206, a multiplier 201, an adder 202, a modular operating unit 203, a determining unit 204, a subtractor 205 and a feedback unit 207. Each of these components corresponds to a logic unit that incorporates a mathematical equation for interleaving which is defined for each transmission mode (for example, four transmission modes in ETSI EN 300 401) as a logic block.

The mode determining unit 206 reads the mode information recorded in a header block of the interleaved data received through the receiving unit 210. Also, the mode determining unit 206 determines a transmission mode of the transmitted data (S511), and outputs various constant values corresponding to the determined transmission mode as respective logic blocks.

The multiplier 201 performs a multiplication operation on a resulting value of a previous modular operation and an interleaving initial constant value (S512). The interleaving initial constant value corresponds to a first multiply constant of a third formula in each of Equations 2, 3, 4 and 5 above. The third formula represents a mathematical equation for interleaving in each of the above-described four transmission modes. For example, the interleaving initial constant value is set to 13 in ETSI EN 300 401.

The interleaving initial constant value is set to 13 for illustrative purposes. However, when a change in the mathematical expression occurs later, the interleaving initial constant value may also change based on the change in the mathematical expression. In some implementations, the interleaving initial constant value may include other applicable values.

The resulting value of previous modular operation corresponds to $\Pi(i-1)$ in each of Equations 2, 3, 4 and 5. An initial value of $\Pi(i)$ is set to $\Pi(0)=0$ as a default value. The below-described values are feedbacked by the feedback unit 207 to be used as the resulting value of the previous modular operation.

The feedback unit 207 as described in this specification is not limited by a specific physical configuration. As shown in FIG. 3, the feedback unit 207 includes any configuration for feedbacking the resulting value of modular operating unit 203 to the multiplier 201.

The adder 202 performs an addition operation on the resulting value of the multiplication operation and an add constant corresponding to the determined transmission mode (S513). The add constant corresponds to a constant of the third formula in each of Equations 2, 3, 4 and 5. For example, the add constant may be 511, 127, 63 and 255 in the Equations 2, 3, 4 and 5 respectively. The add constant corresponding to each transmission mode is added to the resulting value of multiplication operation.

As described above, various constant values (e.g., interleaving initial constant value, add constant, modular constant, constant for allowance or subtract constant) used in the present specification correspond to standard values. These constants can be set to values that are based on the allowable range and application.

The modular operating unit 203 performs a modular operation on the resulting value of the addition operation using a modular constant that corresponds to the determined transmission mode (S514). An item incorporated by the modular operating unit 203 corresponds to the logic of the third formula in each of Equations 2, 3, 4 and 5. For example, the logic may include mod(2048), mod(512), mod(256) and mod(1024) in Equations 2, 3, 4 and 5 respectively. The modular operation calculates a remainder resulting from dividing a dividend by a divisor. For example, the modular constant for these logics can be 2048, 512, 256 and 1024 respectively.

The resulting value of the modular operation is recursively provided as a resulting value of a previous modular operation of the multiplier 201 (S514). In addition, the resulting value is also transmitted to the determining unit 204.

The determining unit 204 receives the resulting value of the modular operation and determines whether the input resulting value of the modular operation is in an allowable range of the determined transmission mode (S515). The determining unit 204 corresponds to a logic unit for performing an operation representing a second formula in each of Equations 2, 3, 4 and 5. When the resulting value of the modular operation is not in an allowable range for each transmission mode, which corresponds to a case that an interleaving index is not produced, the determining unit 204 does not produce the resulting value of the modular operation as an interleaving index. Instead the determining unit 204 is controlled to recursively perform a subsequent operation.

When the resulting value of the modular operation is in an allowable range, the subtractor 205 performs a subtraction operation on the resulting value of the modular operation and a subtract constant that corresponds to the determined transmission mode (S516). The subtractor 205 corresponds to a logic unit that incorporates an operation representing a first formula in each of Equations 2, 3, 4 and 5. The subtract constant corresponds to a high level value for each transmission mode. For example, the subtract constant can include 1024, 256, 128 and 512 for equations 2, 3, 4 and 5 respectively. Further, the received data stored in the buffer storing unit 220 is read based on the interleaving index (S520).

Using at least one combinational logic configuration as described above, a mathematical equation for producing an interleaving index is incorporated as a logic unit. The incorporated logic is represented as a simple logic block. The size of a memory needed for the above-described combinational logic configuration can be about 700 or less when converted into gate count.

However, when using a conventional table memory storing technique for a de-interleaving index, the size of a memory is 29 kilobit (kbit). When converted into gate count, the size of the memory is about 6 kbit. Therefore, the techniques and systems as described in this specification can increase the memory size efficiency by 90% or more than the conventional systems.

Also, a ratio of a look-up table to the entire block of frequency de-interleaver is about 36%. Thus, a downsize effect of 30% or more can be achieved in the memory size.

Further, the modular operating unit 203 performs a modular operation on the resulting value of the addition operation using a bit equal to or lower than the modular constant. As described above, the modular operation corresponds to an operation for outputting a remainder resulted from dividing a dividend by a divisor as a resulting value. The inputted data value includes a digital signal expressed as a binary number. The divisor is expressed as a multiplier of base 2. For example, the divisor can be expressed as $2048=2^{20}$ for transmission mode 1. The divisor can be express as $512=2^9$ for transmission mode 2. Also, the divisor can be expressed as $256=2^8$ for transmission mode 3. For transmission mode 4, the divisor can be expressed as $1024=2^{10}$. In such manner, a lower bit of a binary digit becomes a remainder. Also, only a bit equal to or lower than the modular constant for each transmission mode may be outputted as a resulting value. To incorporate the above-described logic, each logic may be configured of 11 bit or less to the maximum. The maximum can be determined based on the various implementations of this specification.

Only a value within a predetermined range among the calculated values of $\Pi(i)$ is used, and a value not belonging to $d_n$ may exist in the calculated values of $\Pi(i)$. Thus, $\Pi(i)$ is calculated using a clock faster than an actual generation cycle of an index value.

In other words, the actually calculated values of $\Pi(i)$ may contain a data value not belonging to $d_n$ and up to 7 times (transmission mode 1) in a continuous way to the maximum. As compared with speed of data to be transmitted for each transmission mode, preferably an operating frequency for producing the interleaving index is set higher than an operating frequency of data output, preferable 4 times or more. The operating frequency for producing the interleaving is set by a predetermined frequency generator.

Figure 4:
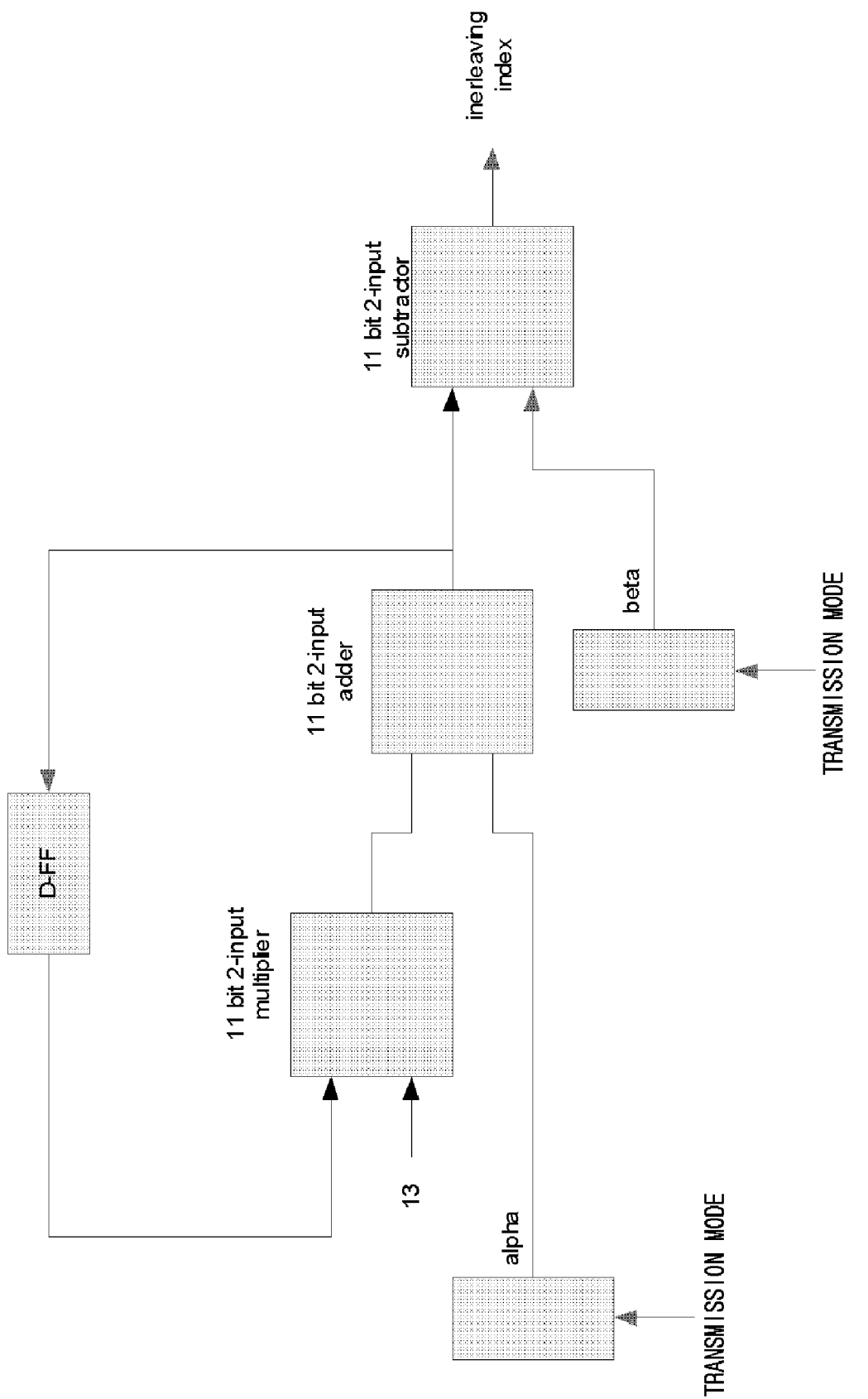
FIG. 4 is a block diagram illustrating an example of a interleaving index producing unit.

FIG. 4 is a block diagram illustrating an example of an interleaving index producing unit. As shown in FIG. 4, a mathematical equation for an interleaving index may be incorporated as a logic block to produce an interleaving index of the interleaved data.

As described above, one of the input variables of the multiplier is '13 add constant' set currently in ETSI EN 300 401. An addition operation is performed on the feedbacked value of a previous operation and the 13 add constant, and the resulting value is inputted into the adder.

The add constant, one of the input variables inputted into the adder, corresponds to alpha for each transmission mode. An addition operation is performed on the add constant and the resulting value inputted from the multiplier. As described above, when an output value is outputted from the adder, a logic unit is configured such that only a lower bit by the modular operation is outputted.

The output value of the adder is transmitted to the feedback unit (D-FF) and at the same time, the output value is inputted as an input variable of the subtractor. Another input variable of the subtractor is a subtract constant represented as beta in FIG. 4. The subtract constant represents a unique value for each transmission mode.

When the output value of the adder is not a value excluded when producing an interleaving index, a subtraction operation is performed on the two input variables (e.g., the output value of the adder and beta for each transmission mode) and a resulting value is outputted. The outputted resulting value becomes an interleaving index.

The de-interleaving techniques described in this specification can be implemented as a computer readable code in a computer readable medium. The computer readable medium includes all kinds of storage devices for storing data readable by a computer system. For example, the computer readable medium is ROM (Read Only Memory), RAM (Random Access Memory), CD-ROM (Compact Disc Read Only Memory), a magnetic tape, and a floppy disc or an optical data storage device. In addition, the computer readable medium may store and execute a code that is dispersed in computer systems connected to each other via a network and is readable by a computer through a dispersion method. Further, functional program, code and code segments for implementing the de-interleaving techniques may be easily inferred by programmers in the prior art.

The de-interleaving apparatus and techniques as described in this specification can perform de-interleaving by a simple structure. The present disclosure describes techniques that eliminate a look-up table reference method for de-interleaving and uses an interleaving index and an interleaving index producing method incorporated as a logic unit. Therefore, the techniques described in this specification can be used to implement de-interleaving using smaller hardware sources to obtain economical and efficient performances.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Only a few implementations and examples are described and other implementations, enhancements and variations can be made based on what is described and illustrated in this application.

What is claimed is:

1. A data processing apparatus, comprising:
a buffer configured to store interleaved data;
an interleaving index producing unit configured to produce an interleaving index of the interleaved data; and
an output control unit configured to output the interleaved data stored in the buffer using the interleaving index,
wherein the interleaving index producing unit is configured to produce the interleaving index using at least one logic block corresponding to a mathematical equation associated with a transmission mode of the interleaved data.

2. The data processing apparatus according to claim 1, wherein the output control unit is configured to output the interleaved data stored in the buffer based on an order of production of the interleaving index.

3. The data processing apparatus according to claim 1, wherein the buffer is configured to sequentially store the interleaved data based on an order of receiving the interleaved data.

4. The data processing apparatus according to claim 1, wherein the interleaving index producing unit comprises:
a mode determining unit configured to determine a transmission mode of the interleaved data;
a multiplier configured to perform a multiplication operation on a resulting value of a previous modular operation and an interleaving initial constant value;
an adder configured to perform an addition operation on a resulting value of the multiplication operation and an add-constant corresponding to the determined transmission mode;
a modular operating unit configured to perform a modular operation on a resulting value of the addition operation using a modular-constant corresponding to the determined transmission mode;
a modular operation determining unit configured to determine whether a resulting value of the modular operation corresponds to an allowable range of the determined transmission mode;
a subtractor configured to perform a subtraction operation on the resulting value of the modular operation and a subtract-constant corresponding to the determined transmission mode when determined that the resulting value of modular operation corresponds to the allowable range of the determined transmission mode; and
a feedback unit configured to feedback the resulting value of modular operation to the multiplier.

5. The data processing apparatus according to claim 4, wherein the modular operating unit is configured to perform a modular operation on the resulting value of addition operation using a bit equal to or lower than the modular-constant of the resulting value of the addition operation.

6. The data processing apparatus according to claim 1, wherein an operating frequency for producing the interleaving index is set higher than an operating frequency of the data output.

7. An interleaving index producing apparatus configured to:
produce an interleaving index of an interleaved data used in de-interleaving output control of the interleaved data stored in a predetermined buffer memory; and
wherein the interleaving index producing apparatus is configured to produce the interleaving index using at least one logic block corresponding to a mathematical equation for interleaving the interleaved data,
wherein the interleaving index producing unit includes a mode determining unit configured to determine a transmission mode of the interleaved data.

8. The interleaving index producing apparatus according to claim 7,
wherein the interleaving index producing unit includes:
a multiplier configured to perform a multiplication operation on a resulting value of a previous modular operation and an interleaving initial constant value;
an adder configured to perform an addition operation on a resulting value of the multiplication operation and an add constant corresponding to the determined transmission mode;
a modular operating unit configured to perform a modular operation on a resulting value of the addition operation using a modular constant corresponding to the determined transmission mode;
a modular operation determining unit configured to determine whether a resulting value of the modular operation is within an allowable range of the determined transmission mode;
a subtractor configured to perform a subtraction operation on the resulting value of modular operation and a subtract constant corresponding to the determined transmission mode when the resulting value of modular operation is within an allowable range of the determined transmission mode; and
a feedback unit configured to feedback the resulting value of modular operation to the multiplier.

9. A data processing method, comprising:
storing interleaved data;
producing an interleaving index of the interleaved data; and
outputting the stored interleaved data using the produced interleaving index,
wherein producing the interleaving index comprises producing the interleaving index using at least one logic block corresponding to a mathematical equation defined for each transmission mode of the interleaved data.

10. The data processing method according to claim 9, wherein outputting comprises outputting the stored interleaved data based on an order of producing the interleaving index.

11. The data processing method according to claim 9, wherein storing the interleaved data comprises sequentially storing the interleaved data based on an order of receiving the interleaved data.

12. The data processing method according to claim 9, wherein producing the interleaving index comprises:
determining a transmission mode of the interleaved data;
performing a multiplication operation on a resulting value of a previous modular operation and an interleaving initial constant value;
performing an addition operation on a resulting value of the multiplication operation and an add constant corresponding to the determined transmission mode;

performing a modular operation on a resulting value of the addition operation using a modular constant corresponding to the determined transmission mode;

determining whether a resulting value of the modular operation is within an allowable range of the determined transmission mode;

performing a subtraction operation on the resulting value of the modular operation and a subtract constant corresponding to the determined transmission mode when the resulting value of the modular operation is determined to be within the allowable range of the determined transmission mode; and feedbacking the resulting value of the modular operation to the multiplier.

13. The data processing method according to claim 12, wherein performing the modular operating comprises performing a modular operation using a bit equal to or lower than the modular constant of the resulting value of the addition operation.

14. The data processing method according to claim 9, further comprising setting an operating frequency for producing the interleaving index at a higher level than an operating frequency of the data output.

15. An interleaving index producing method comprising:

producing an interleaving index of an interleaved data used in de-interleaving output control of the interleaved data stored in a predetermined buffer memory, wherein the interleaving index is produced using at least one logic block corresponding to a mathematical equation for interleaving the interleaved data, wherein producing the interleaving index comprises determining a transmission mode of the interleaved data.

16. The interleaving index producing method according to claim 15, wherein producing the interleaving index comprises:

performing a multiplication operation on a resulting value of a previous modular operation and an interleaving initial interleaving constant value;

performing an addition operation on a resulting value of the multiplication operation and an add constant corresponding to the determined transmission mode;

performing a modular operation on a resulting value of the addition operation using a modular constant corresponding to the determined transmission mode;

determining whether a resulting value of the modular operation is within an allowable range of the determined transmission mode;

performing a subtraction operation on the resulting value of modular operation and a subtract constant corresponding to the determined transmission mode when the resulting value of modular operation is determined to be within the allowable range of the determined transmission mode; and feedbacking the resulting value of the modular operation to the multiplier.

17. A computer readable medium embodying instructions to cause a data processing apparatus to perform de-interleaving comprising:

storing interleaved data;

producing an interleaving index of the interleaved data; and outputting the stored data using the produced interleaving index, wherein producing the interleaving index comprises producing the interleaving index using at least one logic block corresponding to a mathematical equation defined for each transmission mode of the interleaved data.

* * * * *